(12) United States Patent
Sakai

(10) Patent No.: US 6,331,383 B1
(45) Date of Patent: *Dec. 18, 2001

(54) PATTERNING METHOD, AND METHOD FOR MANUFACTURING SEMICONDUCTOR DEVICE

(75) Inventor: Keita Sakai, Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/715,895

(22) Filed: Sep. 19, 1996

(30) Foreign Application Priority Data

Sep. 21, 1995 (JP) .................................... 7-243374

(51) Int. Cl.[7] .............................. G03F 7/38; G03F 7/023
(52) U.S. Cl. .................... 430/325; 430/191; 430/192; 430/270.1; 430/328; 430/926
(58) Field of Search .................................. 430/191, 192, 430/270.1, 926, 328, 325

(56) References Cited

U.S. PATENT DOCUMENTS

| | | | |
|---|---|---|---|
| 4,659,649 | * 4/1987 | Dickinson et al. | 430/270.1 |
| 5,064,741 | * 11/1991 | Koike et al. | 430/270.1 |
| 5,229,254 | * 7/1993 | Lohaus et al. | 430/270.1 |
| 5,256,522 | * 10/1993 | Spak et al. | 430/325 |
| 5,332,648 | * 7/1994 | Kihara et al. | 430/270.1 |
| 5,364,734 | * 11/1994 | Pawlowski et al. | 430/270.1 |

OTHER PUBLICATIONS

W.C. McColgin, et al., "Silicon–added bilayer resist (SABRE) system", SPIE vol. 920 Advances in Resist Technology and Processing V(1988) pp. 260–267.

* cited by examiner

Primary Examiner—John S. Chu
(74) Attorney, Agent, or Firm—Fitzpatrick, Cella, Harper & Scinto

(57) ABSTRACT

A photosensitive composition comprising a photoacid generator for forming an acid by exposing to far ultraviolet light, a pH indicator coloring so as to exhibit an absorption band at the i-line wavelength region in the presence of the acid, and an i-line photosensitizer chemically changing by exposing to the i-line; and methods for patterning and for manufacturing a semiconductor device using such a photosensitive composition.

The photosensitive composition enables etching, fine pattern formation and semiconductor device manufacturing to simplify.

10 Claims, 5 Drawing Sheets

SEMICONDUCTOR DEVICE
MANUFACTURING FLOW CHART

WAFER PROCESS FLOW CHART

PATTERNING METHOD, AND METHOD FOR MANUFACTURING SEMICONDUCTOR DEVICE

BACKGROUND OF THE INVENTION

Field of the Invention and Related Art

The present invention relates to a photosensitive composition, particularly a photosensitive composition used as a resist composition, a method for patterning using the same, and a method for manufacturing a semiconductor device.

A method for forming fine patterns in conventional manufacturing processes of semiconductor devices is described in "Silicon-Added Bilayer Resist (SABRE) System, W. C. McColgine, et, al. SPIE. Vol. 920, pp.260–267 (1988)", for example. The method will be explained with reference to FIGS. 1A to 1D.

As shown FIG. 1A, a resist, e.g. a polyimide resist, is applied onto a semiconductor substrate 4 to form an underlying resist film 3, and then an i-line sensitive resist is applied thereon to form an overlay resist film 2 (hereinafter the combination of the semiconductor substrate 4 and resist films 2 and 3 is called "integral article"). Ultraviolet light, for example, having the i-line wavelength (365 nm) is irradiated to the overlay resist film 2 through a given mask (not shown in the figure) to expose the overlay resist film 2 to the i-line 1. A developed pattern 5 as shown in FIG. 1B is formed by developing the overlay resist film 2. Next, the integral article is exposed to vapor of a sililation agent 6, e.g. hexamethyldisilazane while heating as shown in FIG. 1C. Only the developed pattern 5 is sililated thereby to form a sililated layer 7 on the underlying resist film 3. Then, as shown in FIG. 1D, the underlying resist film 3 is etched by oxygen reactive ion etching (RIE) with an etching mask of sililated layer 7 to form a fine pattern. In FIG. 1D, the resulting $SiO_2$ layer 9 is formed by oxygen plasma 8.

The method for forming a fine pattern set forth above has the following problems:

Dry etching of the underlying resist film 3 is unavoidable to transfer the developed pattern formed in the overlay resist film 2 to the underlying resist film 3. Therefore, an exclusive etcher for organic film must be employed, and the process requires complicated optimization to improve planar uniformity and selective or etching ratio.

In particular, when a general etcher for organic film is used for etching in the transfer of the fine developed pattern in the overlay resist film 2 to the thick underlying resist film 3 (for example, 1.5 $\mu$m thick), a vertical pattern is barely formed. In detail, because the general etcher for organic film has a strong reactivity, the underlying resist film is isotropically etched and undercut. Therefore, an etcher exhibiting a high anisotropic etching characteristic is required for transferring the fine developed pattern in the overlay resist film 2 to the underlying resist film 3.

Further, significantly complicated process optimization is required for the selection of etching gas, the mixing ratio of a plurality of gasses, gas pressure, temperature, Rf bias, extraction voltage bias, and Rf frequency.

SUMMARY OF THE INVENTION

It is an object of the present invention to provide a photosensitive composition not requiring an exclusive etcher and complicated process optimization.

It is another object of the present invention to provide a method for patterning not requiring an exclusive etcher and complicated process optimization.

It is a further object of the present invention to provide a method for manufacturing a semiconductor device not requiring an exclusive etcher and complicated process optimization.

These and other objects are attained by a photosensitive composition characterized in that the transmittance of the light out of the range of the exposing wavelength decreases by the exposure.

In the photosensitive composition, it is preferable that the transmittance of the i-line decreases by exposing the composition to far ultraviolet light. More preferably, the composition contains a photoacid generator for forming an acid by exposing it to far ultraviolet light and a pH indicator which colors the composition so as to exhibit an absorption band comprising the i-line wavelength region in the presence of the acid.

In the second aspect of this invention, a photosensitive composition comprises a photoacid generator for forming an acid by exposing the composition to far ultraviolet light, a pH indicator capable of changing color so as to exhibit an absorption band comprising the i-line wavelength region in the presence of the acid, and an i-line photosensitizer chemically changing by exposing to the i-line.

Preferably, the solubility of the i-line photosensitizer in an alkaline solution varies by exposing to the i-line.

In the third aspect of this invention, a method for patterning comprises: exposing a predetermined portion of a photosensitive composition to far ultraviolet light so as to decrease the transmittance of the i-line at the exposed portion; exposing the photosensitive composition to the i-line; and developing the photosensitive composition.

In the fourth aspect of this invention, a method for manufacturing a semiconductor device comprises: a step for forming a photosensitive film by applying a photosensitive composition, in which the transmittance of the light out of the range of the exposing wavelength decreases by the exposure, to at least a portion of a substrate; a step for exposing a predetermined portion of the photosensitive film to light of a first wavelength region to decrease the transmittance of light of a second wavelength region at the surface layer of the predetermined portion of the photosensitive film; a step for exposing the resist film to the light of the second wavelength region by using the surface layer of the predetermined portion as a mask; and a step for developing the photosensitive film.

Preferably, the light of the first wavelength region is far ultraviolet light and the light of the second wavelength region is i-line.

In the fifth aspect of this invention, a method for patterning comprises: applying a photosensitive composition, in which the transmittance of the i-line decreases by exposing to far ultraviolet light, to a substrate; exposing a predetermined portion of the photosensitive composition to far ultraviolet light to form a portion, in which the transmittance of the i-line decreases, exposing the photosensitive composition to the i-line by acting the predetermined portion as a mask; and developing the photosensitive composition to form a predetermined pattern.

DETAILED DESCRIPTION OF THE PREFERRED EMBODIMENTS

Figure 1A:
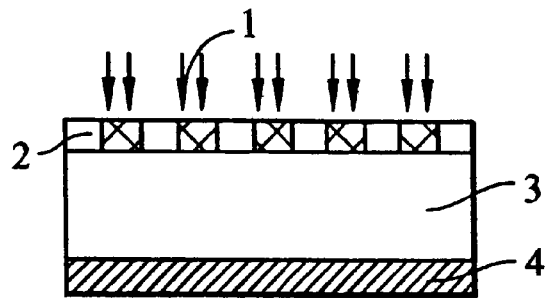
FIG. 1 is schematic cross-section views illustrating a method for forming a fine pattern in a conventional semiconductor manufacturing, wherein 1A to 1D represent each step.
Figure 1B:
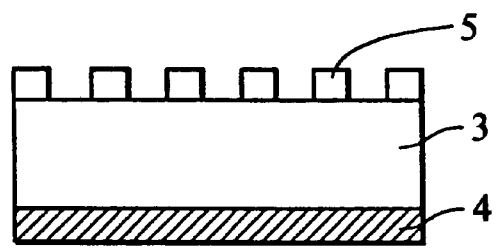
Figure 1C:
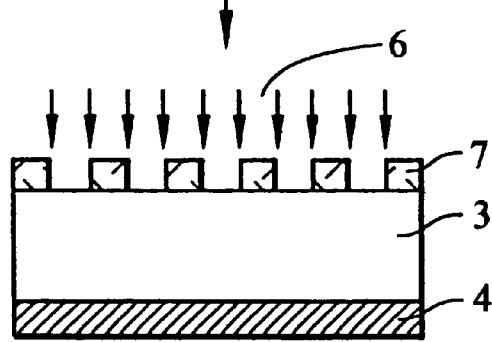
Figure 1D:
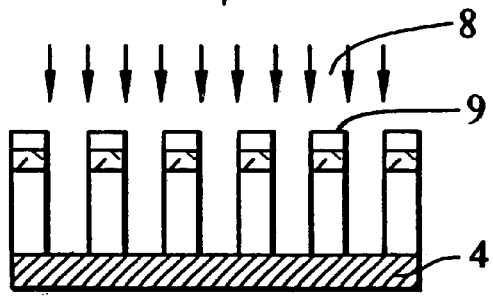

First, a preferred photosensitive composition in accordance with the present invention will be described. In this and subsequent embodiments, the photosensitive composition in accordance with the present invention is used as a resist composition.

The photosensitive composition (resist composition) in accordance with the present invention is preferably one in which the transmittance of the i-line decreases at a constant solubility in a developer solution by exposing the composition to far ultraviolet light, such as excimer laser using KrF or ArF, and the solubility changes in the developer by exposing the composition to the i-line wavelength. The resist composition in accordance with the present invention preferably comprises a base resin, an i-line photosensitizer, a photoacid generator, and a pH indicator coloring so as to exhibit an absorption band comprising the i-line wavelength region in the presence of the acid.

Base resins generally used in i-line resist compositions may be used as the base resin in accordance with the present invention. For example, a novolak resin can be preferably used. Other resins, such as polyvinyl phenol, can also be used.

Photosensitizers generally used in i-line resist compositions may be used as the i-line photosensitizer in accordance with the present invention, and naphthoquinone diazido is preferably used, for example. Naphthoquinone diazido is substantially insoluble to alkaline developer solutions, becomes readily soluble to the alkaline solutions after exposing it to the i-line wavelength. Therefore, the photosensitive composition (resist composition) in accordance with the present invention containing naphthoquinone diazido as the i-line photosensitizer changes to a composition readily soluble to alkaline developers after exposing the composition to the i-line, i.e., a positive-type resist composition. Further, other photosensitizers can be used as the i-line photosensitizer, and desirable positive- or negative-type resist compositions can be prepared according to demand.

When naphthoquinone diazido is used, the content is preferably 15 to 40 weight % of the entire photosensitive composition.

The photoacid generator is one of constituents in chemically amplified resist compositions and generates an acid by exposing the composition to far ultraviolet light, such as an excimer laser using KrF or ArF. Preferred examples of photoacid generators include phenyldiazonium salts, diphenyliodonium salts, triphenyl sulfonium salts, triphenylselenonium salts, sulfonate esters, and o-nitrobenzylsulfonate. The content of the photoacid generator preferably ranges from 3 to 15 weight %, and more preferably from 3 to 7 weight % of the entire photoresist composition.

The pH indicator in accordance with the present invention changes color so as to exhibit an absorption band comprising the i-line wavelength region wherein the absorbance of the i-line increases in the presence of the acid, i.e. the transmittance of the i-line decreases, in the presence of an acid. An acid forms from the photoacid generator by exposing it to an excimer laser using KrF or ArF and, the absorbance band of pH indicator shifts so as to increase he absorbance of the i-line or decrease the transmittance of the i-line. Preferred examples of pH indicators include Bromochlorophenol Blue, Bromocresol Green, Bromocresol Purple, Bromophenol Blue, 2,4-dinitrophenol, 2,5-dinitrophenol, 2,6-dinitrophenol, Methyl Orange, Methyl Violet B, o-nitrophenol, p-nitrophenol, Chlorophenol Red, and Bromothymol Blue. The content of the pH indicator preferably ranges from 2 to 10 weight % of the entire resist composition, and can be adjusted according to the absorbance of the pH indicator at the i-line in the presence of the acid.

Next, the method for patterning in accordance with the present invention is described.

The method for patterning in accordance with the present invention preferably comprises a step for forming a photosensitive film (resist film) by applying a photosensitive composition onto one side of the substrate; a step for decreasing the transmittance of the i-line at the surface layer of the predetermined portion of the resist film (that is, the reverse side of the substrate) by selectively exposing a predetermined portion of the resist film to far ultraviolet light, such as an excimer laser using KrF or ArF; a step for selectively exposing the unmasked portion of the resist film to the i-line by using the predetermined portion of the surface layer of the resin film having a decreased transmittance as a mask; and a step for developing the resist film.

The preferred resist composition used in the present invention contains, as set forth above, at least the base resin, the i-line photosensitizer, the photoacid generator, and the pH indicators coloring so as to exhibit an absorption band comprising the i-line wavelength region in the presence of the acid.

Typical semiconductor substrates, such as Si substrates, can be used as the substrate in accordance with the present invention.

The dosages of the far ultraviolet light and i-line can be adequately modified depending on characteristics of the resist composition used and the like, based on the dosages employed in typical resist patterning.

A fine pattern having a high aspect ratio is obtainable by employing the method for patterning in accordance with the present invention. Further, since the resist film in the present invention is a single film, the process can be simplified.

Next, a preferred method for manufacturing the semiconductor device in accordance with the present invention is described.

Figure 4:
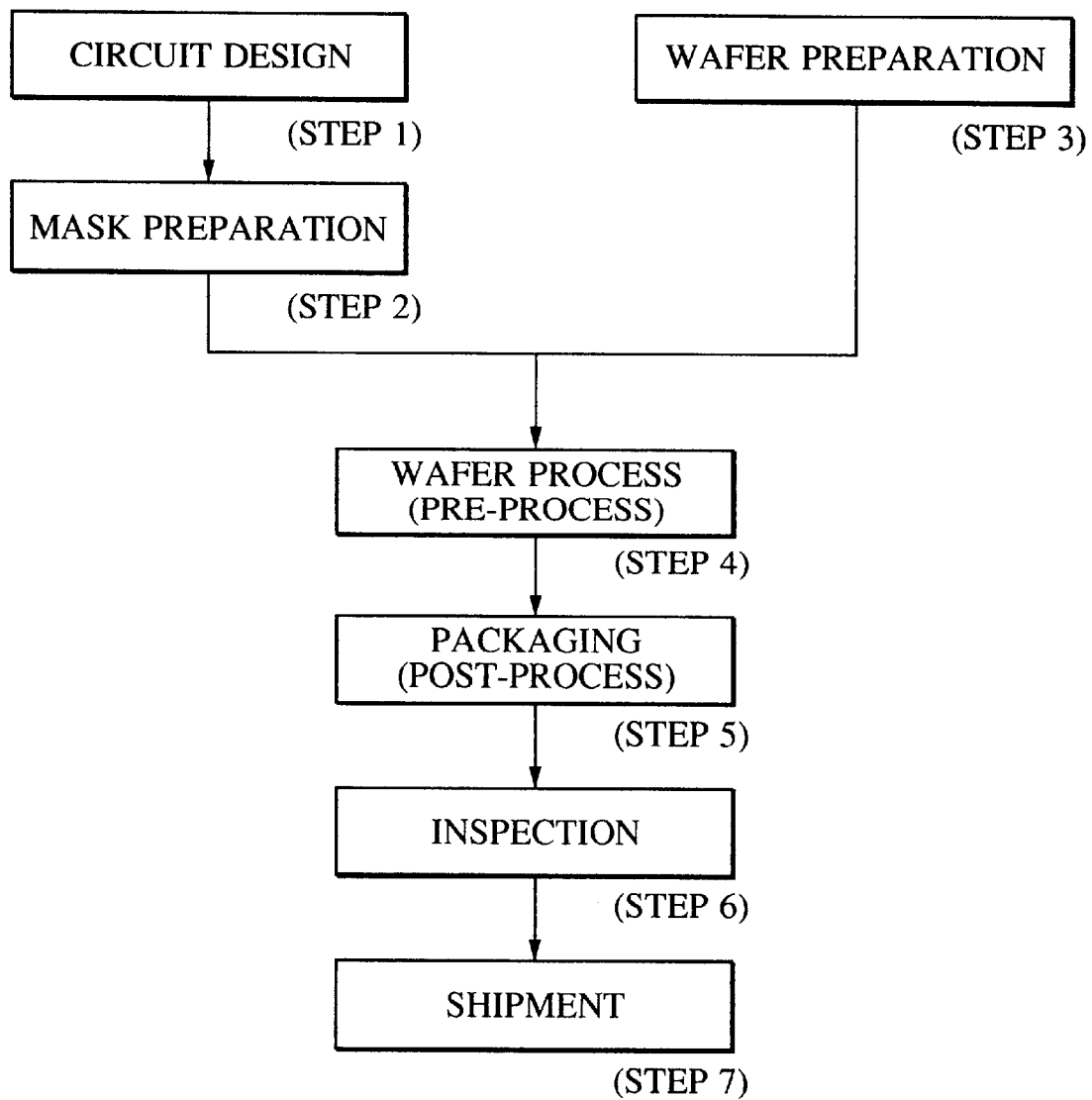
FIG. 4 is a flow chart illustrating an embodiment of a method for manufacturing a semiconductor device in accordance with the present invention.

FIG. 4 is a flow chart illustrating an embodiment of the method for manufacturing a semiconductor device, such as a semiconductor chip, e.g. IC or LSI, a liquid crystal panel, a CCD (charge coupled device), a thin film magnetic recording head, a micromachine, and a microoptics. In FIG. 4, STEP 1 (circuit design) performs the circuit design of the semiconductor device. In STEP 2 (mask preparation), a mask structure is prepared by forming the circuit pattern designed in STEP 1. On the other hand, a wafer is prepared from silicon or the like in STEP 3 (wafer preparation). STEP 4 (wafer process) is referred to as the pre-process. In STEP 4, a practical circuit is formed on the wafer 3 prepared in STEP 3 by photolithography with the mask structure prepared in STEP 2. The following STEP 5 (packaging) is referred to as the post-process, and is the step for manufacturing semiconductor chips from the wafer prepared in STEP 4. STEP 5 includes assembly steps, e.g. dicing and bonding, and packaging step. Finally, in STEP 6, inspections, such as operation test and durability test are carried out with the semiconductor devices manufactured in STEP 5. Semiconductor devices are manufactured through such steps and are shipped (STEP 7).

Figure 5:
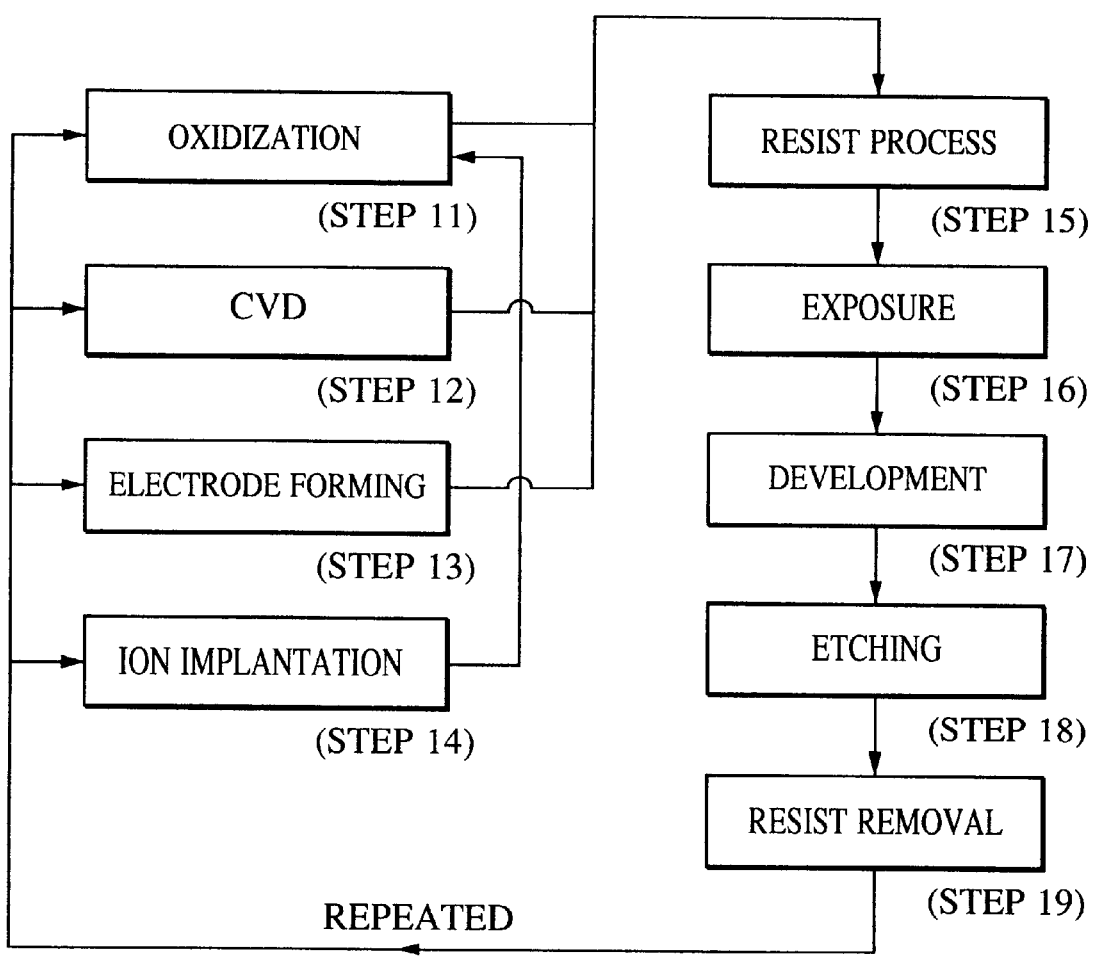
FIG. 5 is a flow chart illustrating the detail of the wafer process in the method shown in FIG. 4.

FIG. 5 is a flow chart illustrating the detail of an embodiment of the wafer process (STEP 4) in FIG. 4. An underlying film is formed by oxidizing the wafer surface in STEP 11 (Oxidization). An insulating film is formed on the wafer surface in STEP 12 (CVD). Electrodes are formed on the wafer by evaporation in STEP 13 (electrode forming). Ions are implanted onto the wafer in STEP 14 (ion implantation). A resist film is formed by applying the photosensitive composition (resist composition) in accordance with the present invention to the wafer in STEP 15 (resist process). In STEP 16 (development), the resist layer is exposed to print the circuit pattern of the mask using the method for exposing in accordance with the present invention; a predetermined portion of the resist film is selectively exposed to far ultraviolet light, such as an excimer laser using KrF or ArF to decrease the transmittance of the i-line on the surface layer of the predetermined portion of the resist film, and the residual unmasked portion of the resist is selectively exposed to the i-line by using the predetermined portion of the resist having a decreased transmittance as a mask. In STEP 17 (development), a pattern is formed by developing the exposed resist film. In STEP 18 (etching), the underlying film of the undeveloped portion is removed by etching. The unneeded resist pattern after etching is removed in STEP 19 (resist removal). A multilayer circuit pattern is formed by repeating such steps.

A highly integrated semiconductor device, which is barely manufactured with conventional methods, can be manufactured by incorporating the method for patterning in accordance with the present invention to the manufacturing process of the semiconductor device.

EXAMPLES

The present invention will now be illustrated by the following representative examples which are not meant to limit the invention's scope. In these EXAMPLES, "parts" means parts by weight.

Example 1

First, a resist solution was prepared by dissolving 5 parts of triphenyl sulfonium trifrate ([S(Ph)$_3$]+[CF$_3$SO$_3$]—, Ph: phenyl) as a photoacid generator, 5 parts of Bromophenol Blue as a pH indicator, 100 parts of m-cresol novolak resin as a base resin, and 5 parts of naphthoquinone diazido as an i-line photosensitizer to prepare a resist solution into 400 parts of propylene glycol monomethylacetate (PGMEA). The resulting resist solution was spin-coated on a quartz substrate and it was baked at 90° C. for 1 minute. A resist film having a thickness of 1.5 $\mu$m and comprising the resist composition was obtained thereby.

The transmittance of the resist film at the i-line wavelength, i.e., 365 nm, measured by a uv-vis spectrophotometer was 30%. Next, the entire surface of the resist film is exposed using a KrF excimer laser stepper of NA=0.45. The transmittance of the resist film after exposure at the i-line wavelength was 5%.

These results demonstrate that the i-line transmittance of the resist after exposure decreases compared with that before exposure. Such decrease suggests that triphenyl sulfonium trifrate (photoacid generator) in the resist film reacts to form an acid by the exposure, and the formed acid shifts the absorption band of Bromophenol Blue (pH indicator) so as to decrease the transmittance of the i-line.

Example 2

Figure 2A:
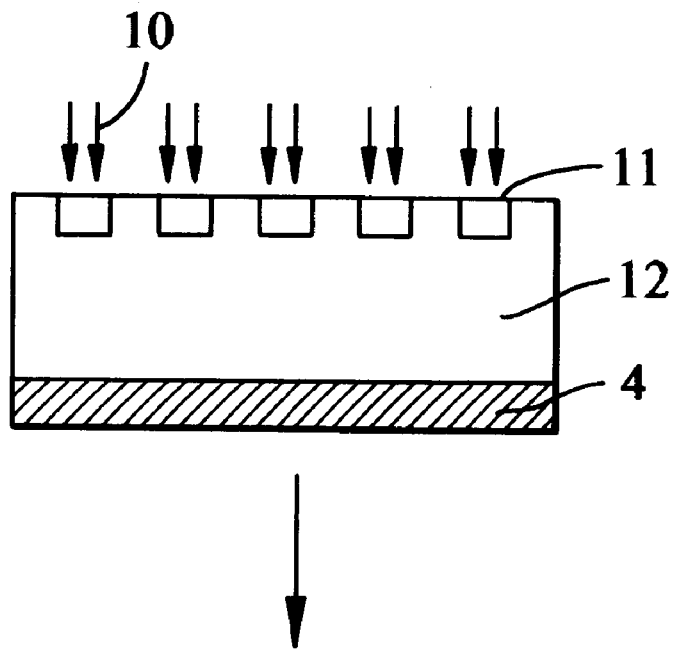
FIG. 2 is schematic cross-section views illustrating an embodiment of a method for forming fine pattern in accordance with the present invention.
Figure 2B:
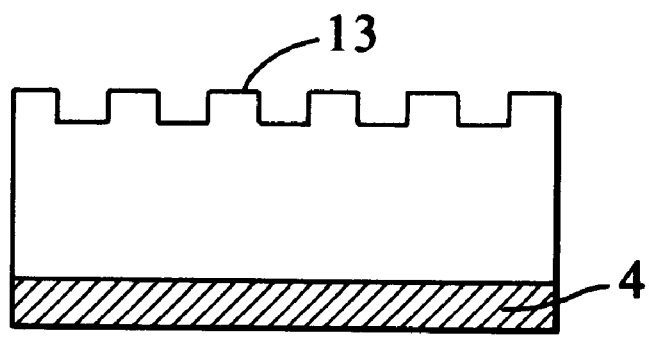

FIGS. 2A and 2B are schematic cross-section views of structures of a semiconductor substrate and a resist on the substrate for illustrating this example.

As shown in FIG. 2A, a resist solution prepared as in Example 1 was spin coated on a Si substrate 4 to form a film thickness of 1.5 $\mu$m, and it was baked at 90° C. for 1 minute to form a resist film 12. Next, far ultraviolet light 10 was irradiated to predetermined regions of the resist film 12 using a KrF excimer laser stepper of NA=0.45 to transfer a reticle pattern. At the predetermined regions of the uppermost surface layer (the reverse side to the Si substrate 4) of the resist film 12 exposed to far ultraviolet light 10, triphenyl sulfonium trifrate (photoacid generator) reacted to form an acid. The acid shifted the absorption band of Bromophenol Blue (pH indicator) to form regions 11 having a decreased transmittance of the i-line on the uppermost surface layer of the predetermined regions. At the same time, naphthoquinone diazido is exposed to far ultraviolet light on the uppermost surface layer of the predetermined regions to form indene carboxylic acid. Thereby, the regions 11 having a decreased transmittance of the i-line changed to be alkaline soluble.

The resist film 12 was developed with 2.38% tetramethylammonium hydroxide (TMAH) solution. The regions 11 having a decreased transmittance were etched to form a developed pattern 13 as shown in FIG. 2B.

The concave portions of the developed pattern 13 do not reach the Si substrate 4: Because the resist film 12 has a low transmittance of the KrF excimer laser, the bottom side (the side on the Si substrate 4) of the resist film 12 is not exposed and the transmittance of the i-line decreases only at the surface layer. These results demonstrate that the regions exposed with the KrF excimer laser stepper are used as the overlay mask.

Example 3

Figure 3A:
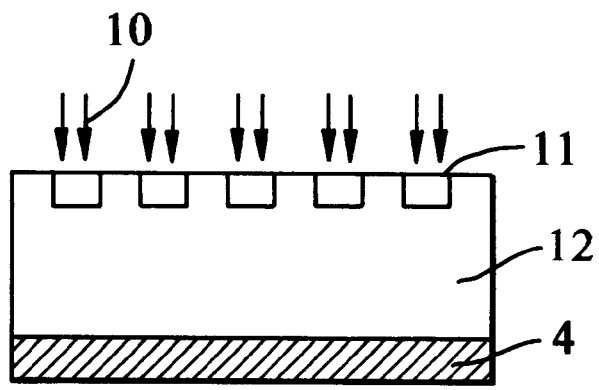
FIG. 3 is schematic cross-section views illustrating another embodiment of the method for forming a fine pattern in accordance with the present invention.
Figure 3B:
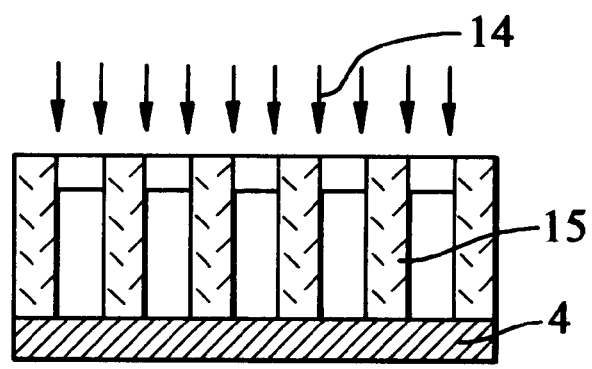
Figure 3C:
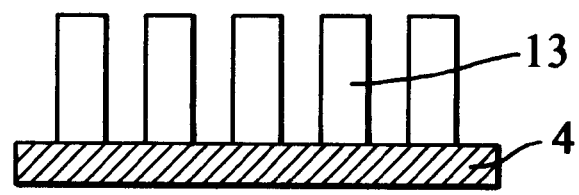

FIGS. 3A, 3B and 3C are schematic cross-section views of structures of a semiconductor substrate and a resist on the substrate for illustrating this example.

As shown in FIG. 3A, a resist solution prepared as in Example 1 was spin coated on a Si substrate 4, which is treated with hexamethyldisilazane (HMDS), to form a film thickness of 1.5 $\mu$m, and it was baked at 90° C. for 1 minute to form a resist film 12. Next, far ultraviolet light 10 was irradiated to predetermined regions of the resist film 12 using a KrF excimer laser stepper of NA=0.45 to transfer a reticle pattern. At the predetermined regions of the uppermost surface layer (the reverse side to the Si substrate 4) of the resist film 12 exposed to far ultraviolet light 10, triphenyl sulfonium trifrate (photoacid generator) reacted to form an acid. The acid shifted the absorption band of Bromophenol Blue (pH indicator) to form regions 11 having a decreased transmittance of the i-line on the uppermost surface layer of the predetermined regions. At the same time, naphthoquinone diazido is exposed to far ultraviolet light 10 on the uppermost surface layer of the predetermined regions to form indene carboxylic acid. Thereby, the regions 11 having a decreased transmittance of the i-line changed to be alkaline soluble. Because the resist film 12 has a low transmittance of the KrF excimer laser, the bottom side (the side on the Si substrate 4) of the resist film 12 is not exposed and the transmittance of the i-line decreases only at the surface layer Thus, the regions 11 having a decreased transmittance of the i-line by exposing with the KrF excimer laser stepper changed to an overlay mask.

Next, as shown in FIG. 3B, the entire surface of the resist film was exposed with an i-line stepper, wherein since the portions 11 having a decreased i-line transmittance act as the overlay mask, the regions, which was not exposed to KrF excimer laser, was exposed to the i-line 14. In the regions not exposed to KrF excimer laser, naphthoquinone diazido insoluble to an alkaline developer solution was sensitized by the exposure to the i-line to form indene carboxylic acid readily soluble to the alkaline developer solution, and thus the i-line sensitized regions 15 exhibiting an enhanced solubility to the alkaline developer solution were formed. Then, the resist film was exposed at 100° C. for 2 minutes.

Next, the resist film 12 was developed with 2.38% tetramethylammonium hydroxide (TMAH) solution. By the development, the portions 11 having a decreased transmittance and the i-line sensitized portion 15 were etched to form a developed pattern 13 as shown in FIG. 3C. The developed pattern reproduced a 0.25 μm line & space pattern with a high resolution.

In the present invention as set forth above, an exclusive dry etcher required for conventional methods for developing the surface image is not necessary, and a conventional wet developing machine can be used. Further, the present invention is applicable to conventional developing processes and does not need a complicated optimization of the dry etching process conditions. Moreover, since the overlay mask is formed by the chemical reaction of an acid with a pH indicator inside the resist in the invention, the position of the overlay mask can be closely controlled, differing from a simple physical diffusion during forming sililated layer as the overlay mask in conventional methods. Additionally, since the resist film in accordance with the present invention is a single film, the process is simplified and intermixing, i.e., mixing between a plurality of resist films, can be prevented.

The invention may be embodied in other specific forms without departing form the spirit or essential characteristics thereof. The present embodiments and examples are therefore to be considered in all respects as illustrative and not restrictive, the scope of the invention being indicated by the appended claims rather than by foregoing description and all changes which some within the meaning and range of equivalency of the claims are thereof intended to be embraced therein.

What is claimed is:

1. A method for patterning comprising:

exposing a predetermined portion of a photosensitive composition to a first wavelength of light so as to decrease the transmittance of a different, second wavelength of light at said exposed portion, wherein said first wavelength is a far ultraviolet wavelength and said second wavelength is an i-line wavelength;

exposing an unmasked portion of the photosensitive composition to the second wavelength of light by using the predetermined portion as a mask to change the solubility of the photosensitive composition in a developer; and developing the photosensitive composition.

2. A method for patterning according to claim 1, wherein the first wavelength light is emitted from an excimer laser using KrF or ArF.

3. A method for patterning according to claim 1, wherein the photosensitive composition comprises a base resin, an i-line photosensitizer which can chemically change by exposure to the i-line wavelength, a photoacid generator for forming an acid by exposure to far ultraviolet light, end a pH indicator capable of changing color so as to exhibit an absorption band comprising the i-line wavelength region in the presence of the acid.

4. A method for patterning according to claim 3, wherein the solubility of said i-line photosensitizer in an alkaline solution varies by exposure to the i-line wavelength.

5. A method for patterning according to claim 3, wherein said photoacid generator comprises at least one selected from the group consisting of phenyldiazonium salts, diphenyliodonium salts, triphenyl sulfonium salts, triphenylselenonium salts, sulfonate esters, and o-nitrobenzylsulfonate.

6. A method for patterning according to claim 3, wherein said pH indicator comprises at least one selected from the group consisting of Bromochlorophenol Blue, Bromocresol Green, Bromocresol Purple, Bromophenol Blue, 2,4-dinitrophenol, 2,5-dinitrophenol, 2,6-dinitrophenol, Methyl Orange, Methyl Violet B, o-nitrophenol, p-nitrophenol, Chlorophenol Red, and Bromothymol Blue.

7. A method for patterning according to claim 3, wherein the photosensitive composition changes solubility to alkaline developers by exposure to the i-line wavelength.

8. A method for patterning according to claim 3, wherein said i-line photosensitizer is naphthoquinone diazido.

9. A method for patterning according to claim 3, wherein said base resin is a novolak resin.

10. A method for manufacturing a semiconductor device comprising the method for patterning according to claim 1.

* * * * *